US007688330B2

(12) United States Patent
Park et al.

(10) Patent No.: US 7,688,330 B2
(45) Date of Patent: Mar. 30, 2010

(54) COLOR PROFILE GENERATION METHOD AND APPARATUS

(75) Inventors: Sang-hyun Park, Suwon-si (KR); Seong-il Park, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 531 days.

(21) Appl. No.: 11/584,569

(22) Filed: Oct. 23, 2006

(65) Prior Publication Data

US 2007/0182754 A1 Aug. 9, 2007

(30) Foreign Application Priority Data

Feb. 3, 2006 (KR) ...................... 10-2006-0010607

(51) Int. Cl.

| | |
|---|---|
| ***G09G 5/02*** | (2006.01) |
| ***G06K 15/02*** | (2006.01) |
| ***H04N 1/60*** | (2006.01) |
| ***H04N 1/46*** | (2006.01) |
| ***G03F 3/00*** | (2006.01) |
| ***G03F 3/08*** | (2006.01) |
| ***G06F 15/00*** | (2006.01) |
| *B41J 1/00* | (2006.01) |

(52) U.S. Cl. ....................... 345/589; 345/581; 345/590; 345/593; 345/601; 358/1.1; 358/1.9; 358/518; 358/523; 382/162; 382/167

(58) Field of Classification Search ................. 345/581, 345/589–593, 597, 619, 156, 173, 600–601, 345/549; 382/162–167, 254, 274, 276, 305; 358/515–520, 3.23, 1.16, 523–524; 348/552–553, 348/557, 577, 582

See application file for complete search history.

(56) References Cited

U.S. PATENT DOCUMENTS

| | | | | |
|---|---|---|---|---|
| 6,930,790 | B1 * | 8/2005 | Forthoffer | .................. 358/1.15 |
| 2003/0123072 | A1 * | 7/2003 | Spronk | ....................... 358/1.9 |

(Continued)

FOREIGN PATENT DOCUMENTS

| | | |
|---|---|---|
| JP | 10-285417 | 10/1998 |

(Continued)

OTHER PUBLICATIONS

Color Managemtn of a Display, "Printing Magazine", the first edition, 2001, Jia Liyuan, Jan. 10, 2001.

*Primary Examiner*—Wesner Sajous
(74) *Attorney, Agent, or Firm*—Roylance, Abrams, Berdo & Goodman, LLP

(57) ABSTRACT

A color profile generation method and apparatus are provided, in which at least one of a reference color and a color table of the reference color on a display screen of an image forming device is displayed and at least one of the reference color and the color table that is not displayed on the display screen is printed, a similar color is determined using the reference color and the color table, and a color profile is generated corresponding to the determined color. Accordingly, color of an image displayed on a display screen of an image forming device are matched with colors of an image printed on a printing medium.

19 Claims, 5 Drawing Sheets
(2 of 5 Drawing Sheet(s) Filed in Color)

U.S. PATENT DOCUMENTS

| | | | | |
|---|---|---|---|---|
| 2005/0083558 | A1* | 4/2005 | Kim | 358/523 |
| 2005/0146531 | A1* | 7/2005 | Rice et al. | 345/593 |
| 2005/0200866 | A1* | 9/2005 | Hoshii et al. | 358/1.9 |
| 2006/0114502 | A1* | 6/2006 | Kang et al. | 358/1.15 |
| 2006/0158670 | A1* | 7/2006 | Park | 358/1.9 |
| 2006/0280360 | A1* | 12/2006 | Holub | 382/162 |
| 2007/0146754 | A1* | 6/2007 | Chang | 358/1.9 |
| 2007/0200867 | A1* | 8/2007 | Reynolds et al. | 345/589 |
| 2008/0228599 | A1* | 9/2008 | Webb et al. | 705/27 |

FOREIGN PATENT DOCUMENTS

| | | | |
|---|---|---|---|
| JP | 2002-290753 | | 10/2002 |
| KR | 1020020053981 | A | 7/2002 |
| KR | 1020060000862 | A | 1/2006 |

* cited by examiner

COLOR PROFILE GENERATION METHOD AND APPARATUS

CROSS-REFERENCE TO RELATED PATENT APPLICATION

This application claims the benefit under 35 U.S.C. § 119(a) of Korean Patent Application No. 10-2006-0010607, filed on Feb. 3, 2006, in the Korean Intellectual Property Office, the entire disclosure of which is hereby incorporated by reference.

FIELD OF THE INVENTION

The present invention relates to an image forming device. More particularly, the present invention relates to a color profile generation method and apparatus for preventing a color difference between a displayed image and a printed image in an image forming device having a display screen.

DESCRIPTION OF THE RELATED ART

Image forming devices have a display function for displaying an image to be printed on a display screen, besides an image printing function. However, in many cases, the colors of an image displayed on the display screen of an image forming device are different from the colors of an image printed by the same image forming device. This happens because a display color profile and a print color profile are generated independently of each other.

Accordingly, there is a need for an improved color profile generation method and apparatus that prevents a color difference between an image displayed on the display screen of an image forming device and an image printed from the image forming device.

SUMMARY OF THE INVENTION

An aspect of exemplary embodiments of the present invention is to address at least the above problems and/or disadvantages and to provide at least the advantages described below. Accordingly, an aspect of exemplary embodiments of the present invention is to provide a color profile generation method and apparatus for preventing a color difference between an image displayed on a display screen of an image forming device and a printed image.

According to an aspect of exemplary embodiments of the present invention, there is provided a color profile generation method, in which at least one of a reference color and a color table of the reference color is displayed on a display screen of an image forming device and at least one of the reference color and the color table that is not displayed on the display screen is printed; a similar color is determined using the reference color and the color table; and a color profile is generated corresponding to the determined color.

According to another aspect of exemplary embodiments of the present invention, there is provided a color profile generation apparatus, in which a display unit displays at least one of a reference color and a color table of the reference color on a display screen of an image forming device; a printing unit prints at least one of the reference color and the color table that is not displayed on the display screen; a color determiner determines a similar color using the reference color and the color table; and a profile generator generates a color profile corresponding to the determined color.

BRIEF DESCRIPTION OF THE DRAWINGS

The patent or application file contains at least one drawing executed in color. Copies of this patent or patent application publication with color drawings will be provided by the Office upon request and payment of the necessary fee. The above and other objects, features and advantages of certain exemplary embodiments of the present invention will be more apparent from the following description taken in conjunction with the accompanying drawings, in which.

Throughout the drawings, the same drawing reference numerals will be understood to refer to the same elements, features and structures.

DETAILED DESCRIPTION OF EXEMPLARY EMBODIMENTS

The matters defined in the description such as a detailed construction and elements are provided to assist in a comprehensive understanding of exemplary embodiments of the invention. Accordingly, those of ordinary skill in the art will recognize that various changes and modification of the embodiments described herein can be made without departing from the scope and spirit of the invention. Also, descriptions of well-known functions and constructions are omitted for clarity and conciseness.

Figure 1:
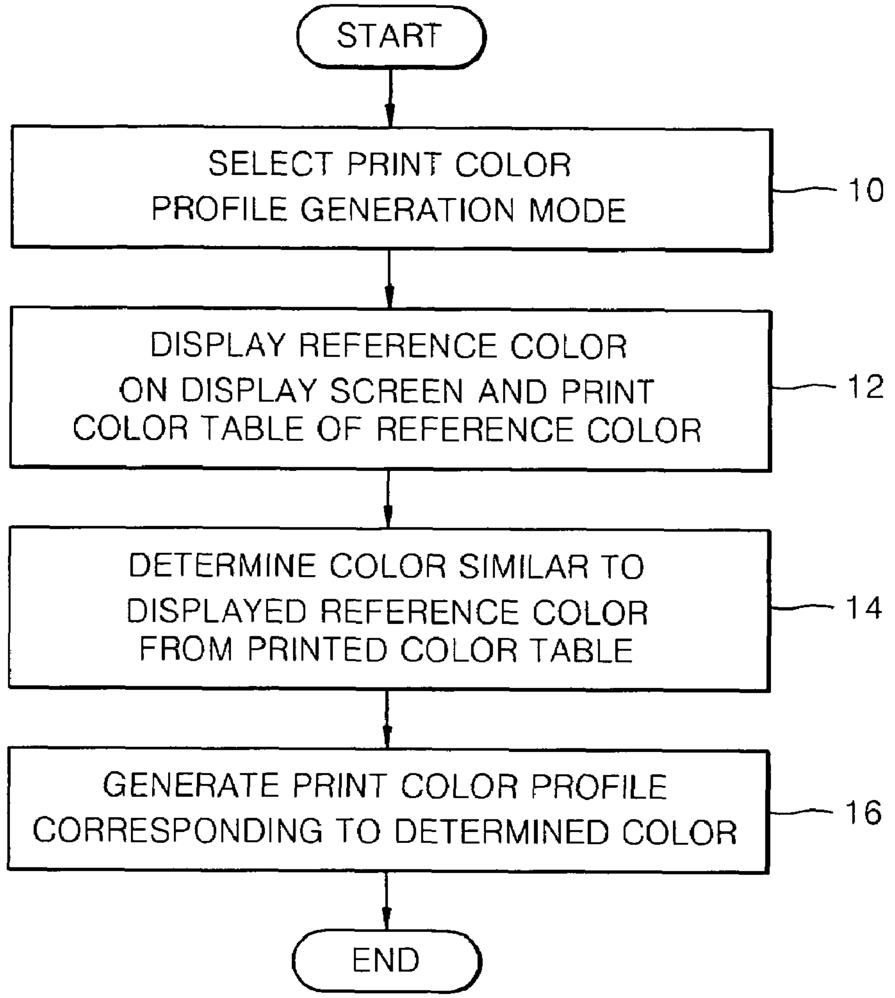
FIG. 1 is a flowchart illustrating a color profile generation method according to an exemplary embodiment of the present invention.

FIG. 1 is a flowchart illustrating a color profile generation method according to an exemplary embodiment of the present invention.

Referring to FIG. 1, in step 10, a print color profile generation mode is selected.

The print color profile generation mode is a mode for generating a print color profile used to print an image in order to obtain a print result without a color difference from an image displayed on a display screen of an image forming device.

In step 12, a reference color is displayed on the display screen of the image forming device, and a color table of the reference color is printed. An example of the image forming device is a photo printer that performs a printing job without the need to use a computer.

The reference color may include more than one color.

The reference color can be composed of R (red), G (green), and B (blue) colors.

Figure 2:
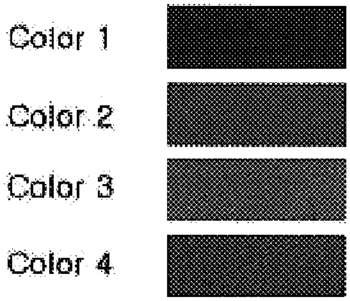
FIG. 2 illustrates a reference color displayed on a display screen.

FIG. 2 illustrates the reference color displayed on the display screen. As illustrated in FIG. 2, the reference color can be composed of C (cyan), M (magenta), Y (yellow), and K (black) colors.

The type and number of colors of the reference color illustrated in FIG. 2 are one example, and various reference colors can be set.

A color table corresponding to the reference color is printed. The color table indicates a set of colors according to brightness variations of each color of the reference color.

Figure 3:
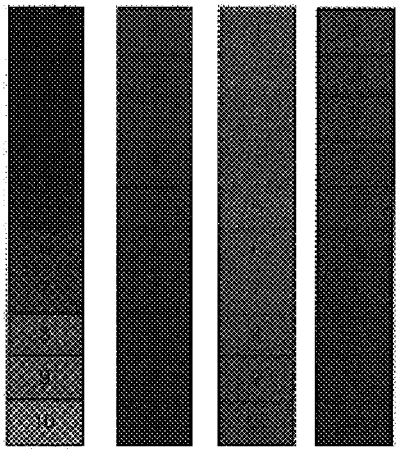
FIG. 3 illustrates a printed color table.

FIG. 3 illustrates a color table of the reference color composed of C, M, Y, and K. As illustrated in FIG. 3, the color table according to brightness variations of C, M, Y, and K is shown.

If the reference color is composed of R, G, and B, a color table according to brightness variations of R, G, and B can be composed.

In step 14, colors similar to the displayed reference color are determined from the printed color table. If a user selects colors similar to the reference color displayed on the display screen from colors of the printed color table, the selected colors are determined as colors similar to the reference color. That is, if colors similar to the displayed reference color are selected from the printed color table using a key panel or touch screen, the selected colors are determined as colors similar to the displayed reference color.

In step 16, a print color profile corresponding to the determined colors is generated. To generate the print color profile corresponding to the determined colors, table values of a prepared print color profile are changed. The table values can be changed by adjusting profile setting variables according to the determined colors.

If a printing job is performed using the modified print color profile, the same colors as those displayed on the display screen can be printed.

Figure 4:
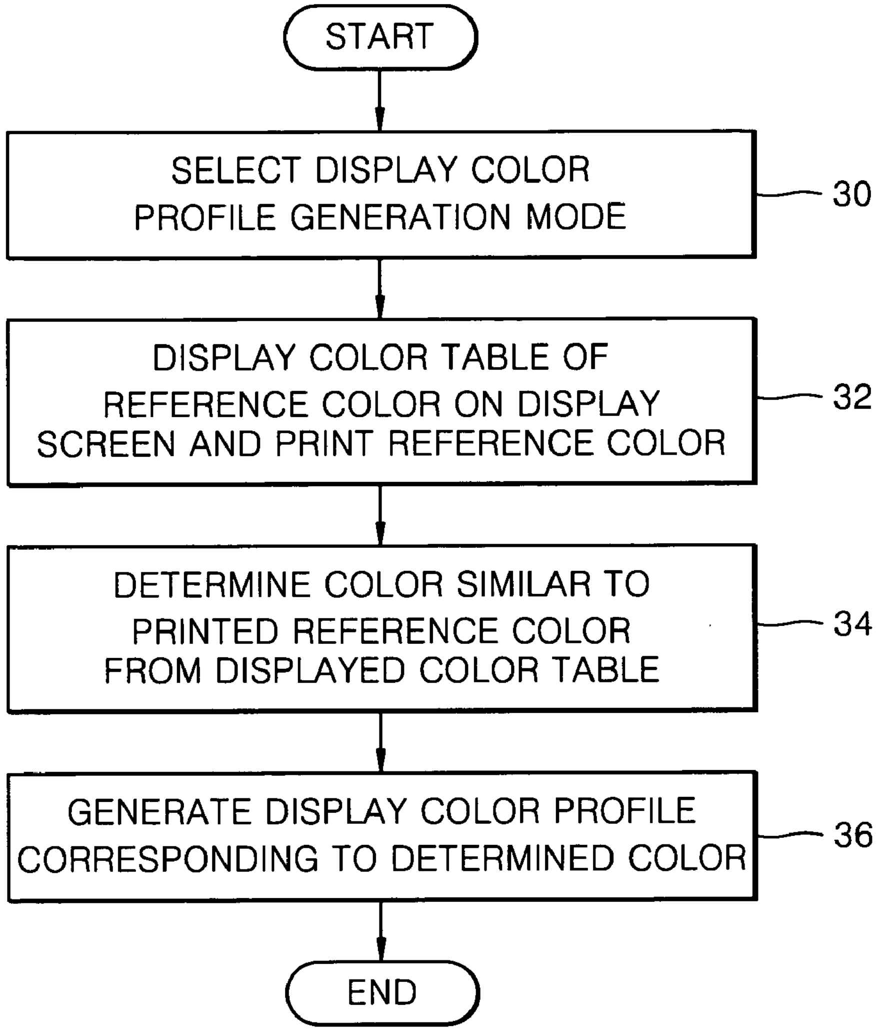
FIG. 4 is a flowchart illustrating a color profile generation method according to an exemplary embodiment of the present invention.

FIG. 4 is a flowchart illustrating a color profile generation method according to an exemplary embodiment of the present invention.

Referring to FIG. 4, in step 30, a display color profile generation mode is selected.

The display color profile generation mode is a mode for generating a display color profile used to display an image in order to obtain colors displayed on a display screen without a color difference from a print result printed by an image forming device.

In step 32, a color table of a reference color is displayed on the display screen of the image forming device, and the reference color is printed.

The reference color may include more than one color.

The reference color can be composed of colors R, G, and B.

Figure 5:
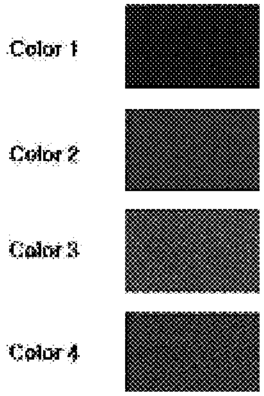
FIG. 5 illustrates a printed reference color.

FIG. 5 illustrates the printed reference color. As illustrated in FIG. 5, the reference color can be composed of C, M, Y, and K colors.

The type and number of colors of the reference color illustrated in FIG. 2 are one example, and various reference colors can be set.

A color table corresponding to the reference color is displayed on the display screen. The color table indicates a set of colors according to brightness variations of each color of the reference color.

Figure 6:
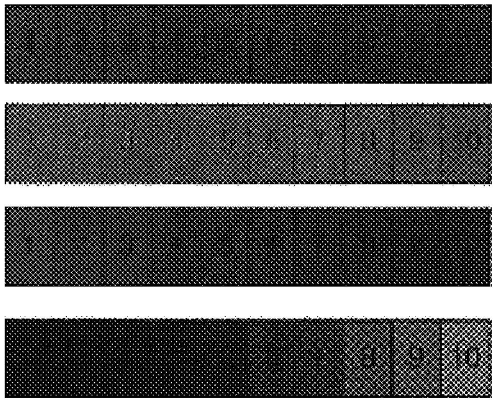
FIG. 6 illustrates a color table displayed on the display screen.

FIG. 6 illustrates a color table of the reference color composed of C, M, Y, and K. As illustrated in FIG. 6, the color table according to brightness variations of C, M, Y, and K is shown.

If the reference color is composed of R, G, and B, a color table according to brightness variations of R, G, and B can be composed.

In step 34, colors similar to the printed reference color are determined from the displayed color table. If the user selects colors similar to the printed reference color from colors of the displayed color table, the selected colors are determined as colors similar to the reference color. That is, if colors similar to the printed reference color are selected from the displayed color table using the key panel or touch screen, the selected colors are determined as colors similar to the printed reference color.

In step 36, a display color profile corresponding to the determined colors is generated. To generate the display color profile corresponding to the determined colors, table values of a prepared display color profile are changed. The table values can be changed by adjusting the profile setting variables according to the determined colors.

If an image is displayed using the modified display color profile, an image having the same colors as those of a printed image can be displayed.

The exemplary embodiments of the present invention can be written as codes/instructions/programs and can be implemented in general-use digital computers that execute the codes/instructions/programs using a computer readable recording medium. Examples of the computer readable recording medium include magnetic storage media (for example, ROM, floppy disks, hard disks, and the like), optical recording media (for example, CD-ROMs or DVDs), and storage media such as carrier waves (for example, transmission through the Internet). The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

A color profile generation apparatus according to an exemplary embodiment of the present invention will now be described in detail with reference to the accompanying drawing.

Figure 7:
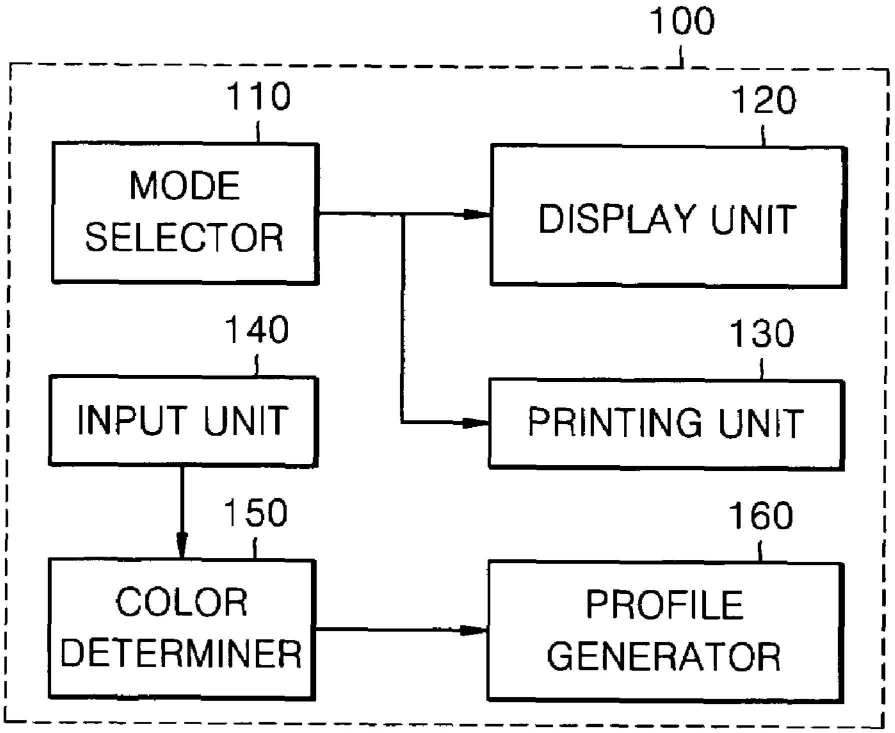
FIG. 7 is a block diagram of a color profile generation apparatus according to an exemplary embodiment of the present invention.

FIG. 7 is a block diagram of a color profile generation apparatus 100 according to an exemplary embodiment of the present invention. Referring to FIG. 7, the color profile generation apparatus 100 includes a mode selector 110, a display unit 120, a printing unit 130, an input unit 140, a color determiner 150, and a profile generator 160.

An image forming device including the color profile generation apparatus 100 can be a photo printer that performs a printing job without the use of a computer.

The mode selector 110 selects the print color profile generation mode or the display color profile generation mode and outputs the selection result to the display unit 120 and the printing unit 130.

The print color profile generation mode is a mode for generating a print color profile used to print an image in order to obtain a print result without a color difference from an image displayed on a display screen of the image forming device.

The display color profile generation mode is a mode for generating a display color profile used to display an image in order to obtain colors displayed on the display screen without a color difference from a print result printed by the image forming device.

The display unit 120 displays a reference color on the display screen of the image forming device in response to the print color profile generation mode selected by the mode selector 110. The display unit 120 also displays a color table of the reference color on the display screen of the image forming device in response to the display color profile generation mode selected by the mode selector 110. The display screen of the image forming device can be a liquid crystal display (LCD) device.

The reference color may include more than one color.

The reference color can be composed of R, G, and B colors or C, M, Y, and K colors as illustrated in FIG. 2.

The type and number of colors of the reference color illustrated in FIG. 2 are one example, and various reference colors can be set.

The printing unit 130 prints a color table corresponding to the displayed reference color in response to the print color profile generation mode selected by the mode selector 110. The printing unit 130 also prints a reference color corresponding to the displayed color table in response to the display color profile generation mode selected by the mode selector 110.

The color table indicates a set of colors according to brightness variations of each color of the reference color.

As illustrated in FIG. 3, the color table according to brightness variations of C, M, Y, and K is shown. If the reference color is composed of R, G, and B, a color table according to brightness variations of R, G, and B can be composed.

The input unit 140 allows a user to select colors similar to the displayed reference color from the printed color table and outputs the selection result to the color determiner 150. The input unit 140 also allows the user to select colors similar to the printed reference color from the displayed color table and outputs the selection result to the color determiner 150. The input unit 140 can be a key panel or touch screen.

The color determiner 150 determines colors similar to the displayed reference color from the printed color table and outputs the determination result to the profile generator 160. The color determiner 150 also determines colors similar to the printed reference color from the displayed color table and outputs the determination result to the profile generator 160.

If the user selects colors similar to colors of the reference color displayed on the display screen from the printed color table, the color determiner 150 determines the selected colors as colors similar to the reference color. If the user selects colors similar to colors of the printed reference color from the displayed color table, the color determiner 150 determines the selected colors as colors similar to the reference color.

The profile generator 160 generates a print color profile or a display color profile corresponding to the colors determined by the color determiner 150.

To generate the print color profile corresponding to the determined colors, the profile generator 160 changes table values of a prepared print color profile. The profile generator 160 changes the table values by adjusting the profile setting variables according to the determined colors.

To generate the display color profile corresponding to the determined colors, the profile generator 160 changes table values of a prepared display color profile. The profile generator 160 changes the table values by adjusting the profile setting variables according to the determined colors.

As described above, by a color profile generation method and apparatus according to exemplary embodiments of the present invention, colors of an image displayed on a display screen of an image forming device are matched with colors of an image printed on a printing medium.

While the present invention has been shown and described with reference to certain exemplary embodiments thereof, it will be understood by those skilled in the art that various changes in form and details may be made therein without departing from the spirit and scope of the present invention as defined by the appended claims and their equivalents.

What is claimed is:

1. A color profile generation method comprising:

displaying a reference color or a color table of the reference color on a display screen of an image forming device and printing the reference color or the color table that is not displayed on the display screen;

determining a similar color using the displayed reference color and the printed color table or the printed reference color and the displayed color table; and generating a color profile corresponding to the determined color.

2. The color profile generation method of claim 1, wherein the displaying of the at least one of the reference color and the color table of the reference color comprises:

if the reference color is displayed on the display screen, printing a color table of the reference color; and if the color table is displayed on the display screen, printing a reference color of the color table.

3. The color profile generation method of claim 1, wherein the determining of the similar color comprises determining at least one of color similar to the displayed reference color from the printed color table and color similar to the printed reference color from the displayed color table.

4. The color profile generation method of claim 1, wherein the determining of the similar color comprise:

selecting at least one of color similar to the displayed reference color and the printed reference color from at least one of the printed color table and the displayed color table using at least one of a key panel and touch screen; and determining the selected color as the similar color.

5. The color profile generation method of claim 1, wherein the generating of the color profile comprises:

if color similar to the displayed reference color is determined from the printed color table, generating a print color profile corresponding to the determined color; and if color similar to the printed reference color is determined from the displayed color table, generating a display color profile corresponding to the determined color.

6. The color profile generation method of claim 1, further comprising selecting a mode for generating a color profile.

7. A color profile generation apparatus comprising:

a display unit for displaying a reference color or a color table of the reference color on a display screen of an image forming device;

a printing unit for printing the reference color or the color table that is not displayed on the display screen;

a color determiner for determining a similar color using the displayed reference color and the printed color table, or the printed reference color and the displayed color table; and a profile generator for generating a color profile corresponding to the determined colors.

8. The color profile generation apparatus of claim 7, wherein the printing unit prints a color table of the reference color if the reference color is displayed on the display screen, and prints a reference color of the color table if the color table is displayed on the display screen.

9. The color profile generation apparatus of claim 7, wherein the color determiner determines color similar to the displayed reference color from at least one of the printed color table and the color similar to the printed reference color from the displayed color table.

10. The color profile generation apparatus of claim 7, further comprising an input unit for facilitating a selection of at least one of color similar to the displayed reference color from the printed color table and color similar to the printed reference color from the displayed color table.

11. The color profile generation apparatus of claim 10, wherein the input unit comprises at least one of a key panel and touch screen.

12. The color profile generation apparatus of claim 7, wherein, if color similar to the displayed reference color is determined from the printed color table, the profile generator generates a print color profile corresponding to the determined color, and if color similar to the printed reference color is determined from the displayed color table, the profile generator generates a display color profile corresponding to the determined color.

13. The color profile generation apparatus of claim 7, further comprising a mode selector for selecting a mode for generating a color profile.

14. The color profile generation apparatus of claim 7, wherein the displaying of the reference color or the color table of the reference color comprises:

if the reference color is displayed on the display screen, printing a color table of the reference color; and if the color table is displayed on the display screen, printing a reference color of the color table.

15. The color profile generation apparatus of claim 7, wherein the determining of the similar color comprises determining at least one of color similar to the displayed reference color from the printed color table and color similar to the printed reference color from the displayed color table.

16. The color profile generation apparatus of claim 7, wherein the determining of the similar color comprise:

selecting at least one of color similar to the displayed reference color and the printed reference color from at least one of the printed color table and the displayed color table using at least one of a key panel and touch screen; and determining the selected color as the similar color.

17. The color profile generation apparatus of claim 7, wherein the generating of the color profile comprises:

if color similar to the displayed reference color is determined from the printed color table, generating a print color profile corresponding to the determined color; and if color similar to the printed reference color is determined from the displayed color table, generating a display color profile corresponding to the determined color.

18. The color profile generation apparatus of claim 7, further comprising selecting a mode for generating a color profile.

19. A color profile generation apparatus comprising:

a means for displaying a reference color or a color table of the reference color on a display screen of an image forming device;

a means for printing the reference color or the color table that is not displayed on the display screen;

a means for determining a similar color using the displayed reference color and the printed color table, or the printed reference color and the displayed color table; and a means for generating a color profile corresponding to the determined colors.

* * * * *